(12) United States Patent
Lee et al.

(10) Patent No.: US 7,372,286 B2
(45) Date of Patent: May 13, 2008

(54) MODULAR PROBE CARD

(75) Inventors: Yi-Chang Lee, Tainan (TW); An-Hong Liu, Tainan (TW); Hsiang-Ming Huang, Tainan (TW); Yao-Jung Lee, Tainan (TW); Yeong-Her Wang, Tainan (TW)

(73) Assignees: ChipMOS Technologies (Bermuda) Ltd., Hamilton (BM); ChipMOS Technologies Inc., Hsinchu (TW)

( * ) Notice: Subject to any disclaimer, the term of this patent is extended or adjusted under 35 U.S.C. 154(b) by 144 days.

(21) Appl. No.: 11/322,408

(22) Filed: Jan. 3, 2006

(65) Prior Publication Data

US 2007/0152689 A1    Jul. 5, 2007

(51) Int. Cl.
*G01R 1/073* (2006.01)

(52) U.S. Cl. .................. 324/757; 324/754

(58) Field of Classification Search .......... None
See application file for complete search history.

(56) References Cited

U.S. PATENT DOCUMENTS 5,974,662 A    11/1999  Eldridge et al. ........... 29/842
6,812,718 B1 *  11/2004  Chong et al. ............. 324/754
7,154,284 B2 *  12/2006  Fan et al. ................. 324/754

FOREIGN PATENT DOCUMENTS

TW           493756           7/2002

* cited by examiner

*Primary Examiner*—Ernest Karlsen
(74) *Attorney, Agent, or Firm*—Troxell Law Office, PLLC

(57) ABSTRACT

A modular probe card comprises a printed circuit board, an interposer, and a probe head where the printed circuit board has a plurality of first contact pads, the probe head has a plurality of second contact pads. The interposer is disposed between the printed circuit board and the probe head where the interposer includes a substrate and a plurality of pogo pins. The substrate has a first surface, a second surface, and a plurality of through holes penetrating from the first surface to the second surface. The pogo pins are secured in the through holes of the substrate. Each of the pogo pins has a first contact point, a second contact point, and a spring therebetween, whereby the first contact points are elastically extruded from the first surface to contact the first contact pad, and the second contact points are elastically extruded from the second surface to contact the second contact pad, so as to overcome the poor electrical connections between the printed circuit board and the probe head through the interposer due to poor coplanarity of the first contact pads of the printed circuit board.

6 Claims, 2 Drawing Sheets

MODULAR PROBE CARD

FIELD OF THE INVENTION

The present invention relates to tooling for testing IC, and more particularly, to a modular probe card.

BACKGROUND OF THE INVENTION

During the fabrication of integrated circuits, ICs, a plurality of IC chips are fabricated on a semiconductor wafer. After singulation, the individual chips are packaging into IC components. To ensure good functions and designed performance, there are several testing steps involved before sending to the customers.

Testing of IC chips on a wafer before singulation is called chip probing or wafer sorting. Since the design of IC chips becomes more complicated, therefore, through chip probing or wafer sorting, the yield of the fabricated wafer can be determined then feed back to IC fab for process improvement.

An IC tester for chip probing or wafer sorting has a test head on which a probe card is installed as a signal transmitting medium between the tester and the wafer under test.

As revealed in U.S. Pat. No. 5,974,662, a conventional interposer of a modular probe card comprises a substrate and a plurality of resilient contact structures where the resilient contact structures are curved probes formed on the top surface and on the bottom surface of the substrate. Each resilient contact structure has a soft core overcoated with a hard material. The soft cores are used to form the desired shape and the hard material is formed on exposed surfaces of the cores. When the interposer is disposed between the probe head and the printed circuit board of a probe card, the resilient contact structures on the interposer will make electrical connections between the probe head and the printed circuit board. Since the resilient contact structures are curved probes disposed on the substrate, it is very difficult to control contact tips of all the curved probes. Moreover, when the interposer is disposed between the probe head and the printed circuit board, the curved probes can be easily damaged and deformed so that the interposer can not be reused.

Furthermore, another conventional interposer for modular probe card as revealed in R.O.C. Taiwan patent publication No. 493,756, a universal probe card comprises an interposer, a printed circuit board, and a probe head where one surface of the interposer has a plurality of first contact pins and the other surface a plurality of second contact pins. The pitches between the first contact pins are the same, so as the pitches between the second contact pins. The printed circuit board has testing circuits fabricated in it which is interchangeable. One surface of the printed circuit board is electrically connected to the test head of a tester and the other surface has a plurality of first through holes where the pitches of the first through holes are the same as the first contact pins on the interposer so that the first contact pins of the interposer can contact with the corresponding first through holes. The probe head has a plurality of probes fabricated on one surface and the second through holes on the other surface where the pitches of the second through holes is the same as the second contact pins of the interposer so that the second contact pins of the interposer can contact with the corresponding second through holes. However, due to different thermal expansion coefficients, CTEs, between the printed circuit board and the interposer, the pitches of the plurality of the first through holes on the printed circuit board will be changed due to temperature gradients. Therefore, the plurality of the first contact pins on the interposer can not fully contact with the plurality of the first through holes on the printed circuit board leading to electrical connection failure.

SUMMARY OF THE INVENTION

The main purpose of the present invention is to provide a modular probe card having an interposer with a plurality of pogo pins secured in the through holes. The interposer is disposed between the probe head and the printed circuit board of a probe card. The pogo pins have a plurality of first contact points elastically extruded from the first surface of the interposer and a plurality of second contact points elastically extruded from the second surface of the interposer. Even though the contact pads of the printed circuit board have poor coplanarity, the first contact points of the pogo pins still can elastically contact with the corresponding contact pads of the printed circuit board due to their elastic characters. Thus, the electrical connection failure of a conventional interposer with extruded probes or bumps can be eliminated.

The second purpose of the present invention is to provide a modular probe card where a plurality of pogo pins are secured in an interposer. The elastic extruded height of the first contact points of the pogo pins from the first surface is less than 1 mm. The first contact points can fully contact the first contact pads of the printed circuit board under a wider warpage tolerance of the printed circuit board. The second contact points of the pogo pins are elastically extruded from the second surface to overcome poor electrically connections due to the coplanarity issue on the printed circuit board and on the probe head.

According to the present invention, a modular probe card comprises a printed circuit board, a probe head, and an interposer. Therein, a plurality of first contact pads are formed on the printed circuit board. A plurality of second contact pads are formed on the probe head which are electrically contacted with the wafers under test. An interposer is disposed between the printed circuit board and the probe head where the interposer comprises a substrate and a plurality of pogo pins. The substrate has a first surface and a second surface and a plurality of through holes penetrating from the first surface to the second surface. A plurality of pogo pins are secured in the through holes of the substrate. Each pogo pin has a first contact point, a second contact point, and a spring where the first contact points are elastically extruded from the first surface to electrically contact the first contact pads and the second contact points are elastically extruded from the second surface to electrically contact the second contact pads.

DETAIL DESCRIPTION OF THE INVENTION

Please refer to the attached drawings, the present invention will be described by means of embodiment(s) below.

Figure 1:
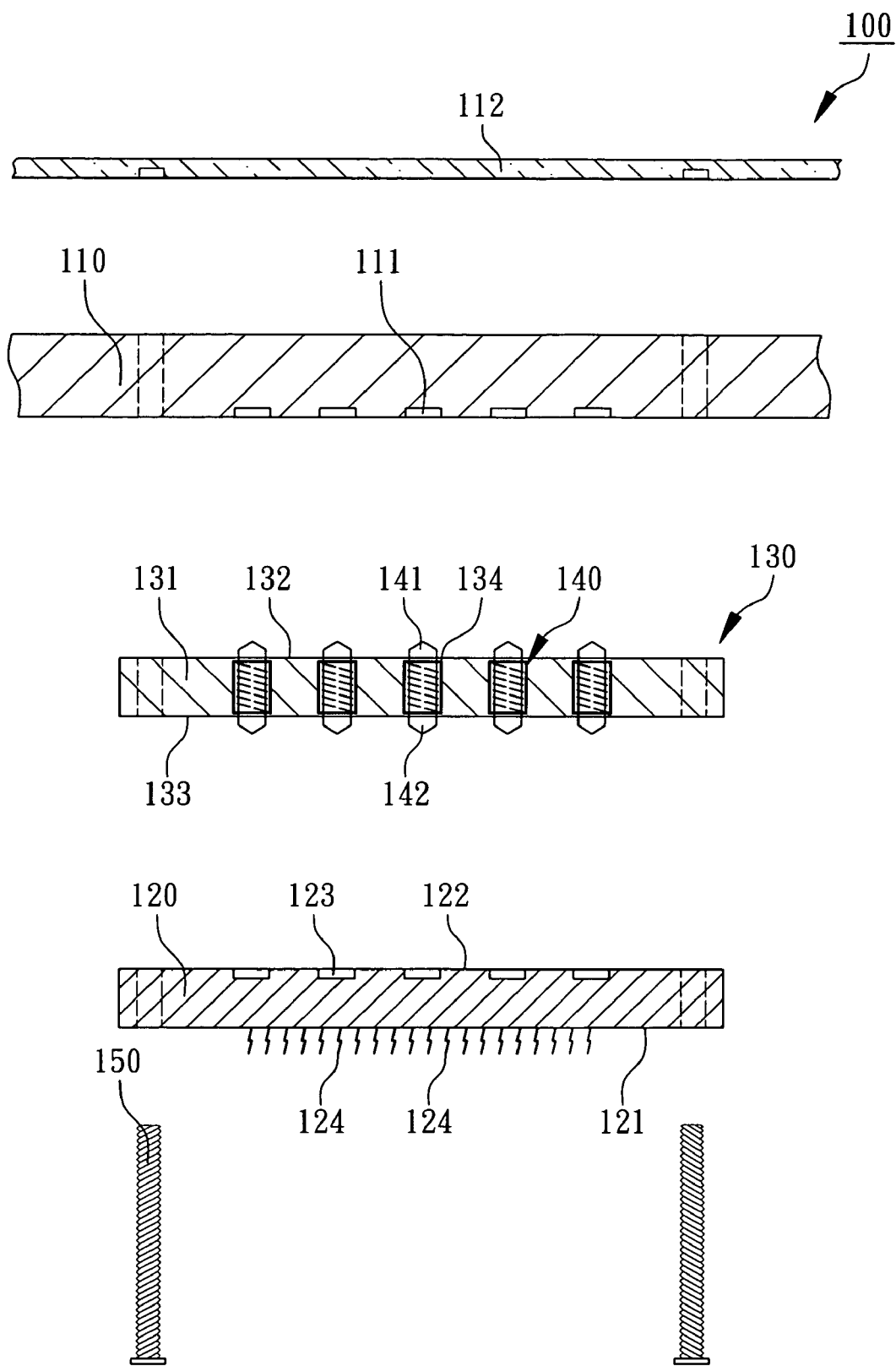
FIG. 1 is a cross-sectional view of a modular probe card before assembling according to an embodiment of the present invention.
Figure 2:
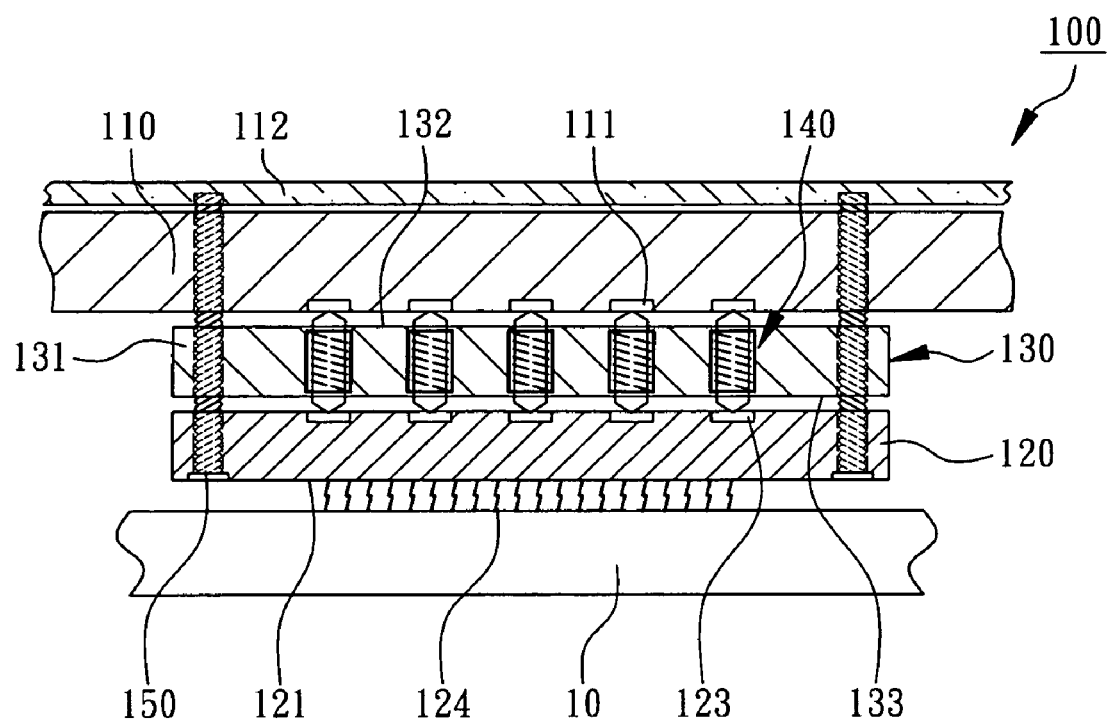
FIG. 2 is a cross-sectional view of the modular probe card when probing a wafer under test according to the embodiment of the present invention.

According to the embodiment of the present invention, a modular probe card is illustrated as shown in FIG. 1 and FIG. 2. The modular probe card 100 comprises a printed circuit board 110, a probe head 120, and an interposer 130 where the printed circuit board 110 has a plurality of first contact pads 111, and the probe head 120 has a plurality of second contact pads 123. The printed circuit board 110 is made from FR-4, FR-5, or BT resin with a multi-layer circuit design for mounting to a test head of an IC tester. The probe head 120 has a contact surface 121 and a joint surface 122 where a plurality of probes 124 are formed on the contact surface 121 such as vertical MEMS probes or elastic probes to probe a wafer 10 under test (as shown in FIG. 2), or other integrated circuits such as tape carrier packages (TCP), or chip-on-film packages (COF). The second contact pads 123 are formed on the joint surface 122, preferably, the second contact pads 123 are disposed in array.

Figure 3:
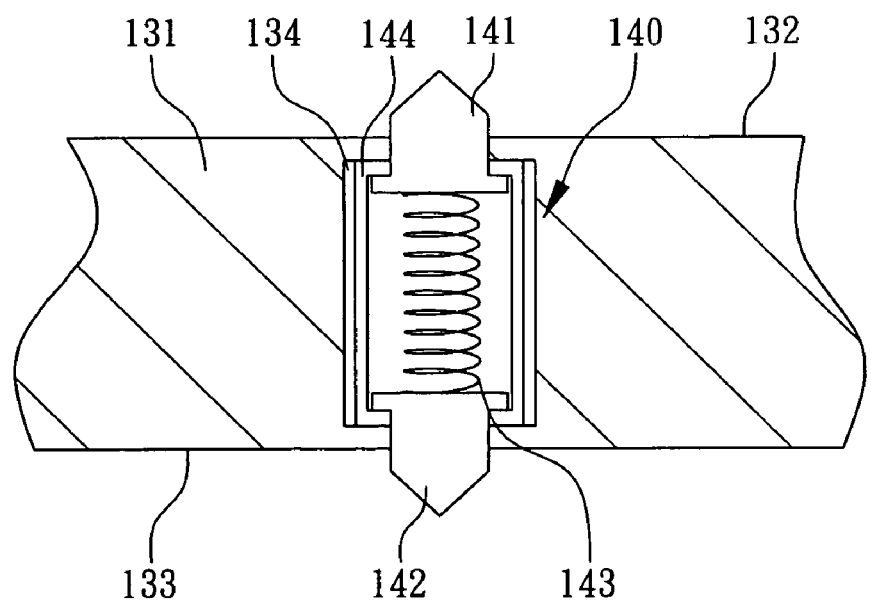
FIG. 3 is an enlarged cross-sectional view of an interposer of the modular probe card according to the embodiment of the present invention.

The interposer 130 is disposed between the printed circuit board 110 and the probe head 120 by modular assembling. The interposer 130 includes a substrate 131 and a plurality of pogo pins 140. The substrate 131 is made from plastic, ceramic, glass, or silicon, wherein plastic substrate is preferable. As shown in FIG. 3, the substrate 131 has a first surface 132, a second surface 133, and a plurality of through holes 134 where the through holes 134 penetrate from the first surface 132 to the second surface 133. The pogo pins 140 are secured in the through holes 134 of the substrate 131 for electrically contacting the first contact pads 111 of the printed circuit board 110 and the second contact pads 123 of the probe head 120. Each of the elastic pogo pins 140 has a first contact point 141, a second contact point 142 and a spring 143 therebetween. In this embodiment, each of the elastic pogo pins 140 has a sleeve 144 fixed in the through holes 134 of the interposer 130. The springs 143 are accommodated in the corresponding sleeves 144 to provide elasticity to the corresponding first contact points 141 and the corresponding second contact points 142. By means of the springs 143, the first contact point 141 can be elastically extruded from the first surface 132 to electrically contact the first contact pads 111 of the printed circuit board 110, and the second contact points 142 can be elastically extruded from the second surface 133 to electrically contact the second contact pads 123 of the probe head 120. Normally the elastically extruded height of the first contact point 141 from the first surface 132 is less than 1 mm so that the first contact points 141 contact the first contact pads 111 of the printed circuit board 110 with good electrical connections allowing a larger warpage tolerance of the printed circuit board 110. Similarly, the elastically extruded height of the second contact points 142 from the second surface 133 is also less than 1 mm. Preferably, the interposer 130 is non-detachably connected with the probe head 120 with the joint surface 122 facing the interposer 130 to keep good electrical connections between the second contact points 142 of the interposer 130 and the second contact pads 123 of the probe head 120.

As shown in FIG. 2, when the modular probe card 100 is probing a wafer 100, testing temperatures may be raised or heat may be generated. Since the coefficients of thermal expansion, CTEs, between the printed circuit board 110 and the interposer 130 are difference, therefore, the warpage of the printed circuit board 110 will cause the coplanarity of the first contact pads 111 to be worse, i.e., the coplanarity of the first contact pads 111 of the printed circuit board 110 may be worse than or equal to the coplanarity of the second contact pads 123 of the probe head 120 leading to different gaps between the printed circuit board 110 and the interposer 130. According to the embodiment of the present invention, the springs 143 of the elastic pogo pins 140 will allow each first contact point 141 having a different extruded height, so as to contact the corresponding second contact points 142. Moreover, the extruded heights of the first contact point 141 and the second contact point 142 of the elastic pogo pins 140 can be different. Therefore, the gap variations between the printed circuit board 110 and the interposer 130 due to the warpage or poor coplanarity of the printed circuit board 110 can be compensated by the pogo pins 140 to ensure all the first contact points 141 can have good electrical contact with all the first contact pads 111 of the printed circuit board 110.

Preferably, a metal plate 112 is disposed on the opposite surface of the first contact pads 111 of the printed circuit board 110 as an anti-warpage assembly, and alignment element for the modular probe card 100. For example, a plurality of screws 150 penetrate the peripheries of the probe head 120, the peripheries of the substrate 131 of the interposer 130, and the holes of the printed circuit board 110 to screw to the screw holes in the metal plate 112 to firmly joint the probe head 120, the interposer 130, and the printed circuit board 110 together. Therefore, the metal plate 112 can firmly hold the probe head 120 and the interposer 130 on the corresponding positions of the printed circuit board 110 to avoid warpage and deformation of the printed circuit board 110.

The above description of embodiments of this invention is intended to be illustrative and not limiting. Other embodiments of this invention will be obvious to those skilled in the art in view of the above disclosure.

What is claimed is:

1. A modular probe card comprising:
a printed circuit board having a plurality of first contact pads;
a probe head having a plurality of probes and a plurality of second contact pads;
an interposer disposed between the printed circuit board and the probe head, the interposer includes a substrate and a plurality of pogo pins, wherein the substrate has a first surface, a second surface, and a plurality of through holes penetrating from the first surface to the second surface, the pogo pins are secured in the through holes, each pogo pin has a first contact point, a second contact point, and a spring therebetween, whereby the first contact points are elastically extruded from the first surface to electrically contact the first contact pad, and the second contact points are elastically extruded from the second surface to electrically contact the second contact pad; and
a metal plate disposed on the printed circuit board for assembling the probe head, the interposer, and the printed circuit board together with a plurality of joint elements, the printed circuit board has a plurality of through holes, the plurality of joint elements pass through the plurality of through holes in the printed circuit board and connect to the metal plate.

2. The modular probe card of claim 1, wherein the elastic extruded height of the first contact point from the first surface is less than 1 mm.

3. The modular probe card of claim 2, wherein the probe head has a contact surface and a joint surface, the probes are disposed on the contact surface, and a plurality of second contact pads are formed on the joint surface in array.

4. The modular probe card of claim 3, wherein the joint surface of the probe head faces the second surface of the interposer.

5. The modular probe card of claim 1, wherein the interposer is non-detachably connected with the probe head.

6. The modular probe card of claim 1, wherein each of the pogo pins has a sleeve installed in the through holes for accommodating the corresponding springs.

* * * * *